United States Patent
Li

(10) Patent No.: US 9,390,968 B2
(45) Date of Patent: Jul. 12, 2016

(54) LOW TEMPERATURE THIN WAFER BACKSIDE VACUUM PROCESS WITH BACKGRINDING TAPE

(75) Inventor: Eric J. Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 206 days.

(21) Appl. No.: 13/997,992

(22) PCT Filed: Sep. 29, 2011

(86) PCT No.: PCT/US2011/054023
§ 371 (c)(1),
(2), (4) Date: Jun. 25, 2013

(87) PCT Pub. No.: WO2013/048415
PCT Pub. Date: Apr. 4, 2013

(65) Prior Publication Data
US 2013/0295763 A1    Nov. 7, 2013

(51) Int. Cl.
*H01L 21/768* (2006.01)
*H01L 21/683* (2006.01)

(52) U.S. Cl.
CPC ...... *H01L 21/76838* (2013.01); *H01L 21/6836* (2013.01); *H01L 2221/6834* (2013.01); *H01L 2221/68327* (2013.01); *H01L 2221/68381* (2013.01)

(58) Field of Classification Search
CPC .............. H01L 21/6836; H01L 21/76838; H01L 2221/68327; H01L 2221/6834; H01L 2221/68381; H01L 21/70; H01L 23/544; H01L 21/58; H01L 2224/83191; H01L 24/27; C09J 7/02; C09J 2201/28; C09J 2201/36
USPC ........................................ 438/618; 156/380.9
See application file for complete search history.

(56) References Cited

U.S. PATENT DOCUMENTS

| | | | |
|---|---|---|---|
| 6,580,153 B1 * | 6/2003 | Glenn et al. | 257/620 |
| 6,688,948 B2 | 2/2004 | Lo | |
| 7,060,351 B2 * | 6/2006 | Hannington | 428/343 |
| 2001/0055928 A1 * | 12/2001 | Eevers et al. | 442/394 |
| 2002/0050246 A1 * | 5/2002 | Parkhe | 118/500 |
| 2007/0004171 A1 * | 1/2007 | Arana et al. | 438/455 |
| 2007/0066184 A1 * | 3/2007 | Nagamoto et al. | 451/41 |
| 2008/0230911 A1 * | 9/2008 | Li | 257/757 |
| 2011/0030881 A1 | 2/2011 | Sasaki et al. | |
| 2011/0059612 A1 * | 3/2011 | Nakata et al. | 438/691 |
| 2011/0139375 A1 | 6/2011 | Yamamoto et al. | |

OTHER PUBLICATIONS

International Search Report and Written Opinion mailed May 23, 2012 for PCT/US2011/054023 filed Sep. 29, 2011, 11 pages.

* cited by examiner

*Primary Examiner* — Marvin Payen
*Assistant Examiner* — Victor Barzykin
(74) *Attorney, Agent, or Firm* — Blakely, Sokoloff, Taylor & Zafman LLP

(57) ABSTRACT

Vacuum processing, such as a backside metallization (BSM) deposition, is performed on a taped wafer after a gas escape path is formed between a base film of the tape and the wafer frontside surface following backgrind. Venting provided by the gas escape path reduces formation of bubbles under the tape. The gas escape path may be provided, for example, by a selective pre-curing of tape adhesive, to breach an edge seal and place the wafer frontside surface internal to the edge seal in fluid communication with an environment external to the edge seal. With the thinned wafer supported by the pre-cured tape, BSM is then deposited while the wafer and tape are cooled, for example, via a cooled electrostatic chuck.

19 Claims, 14 Drawing Sheets

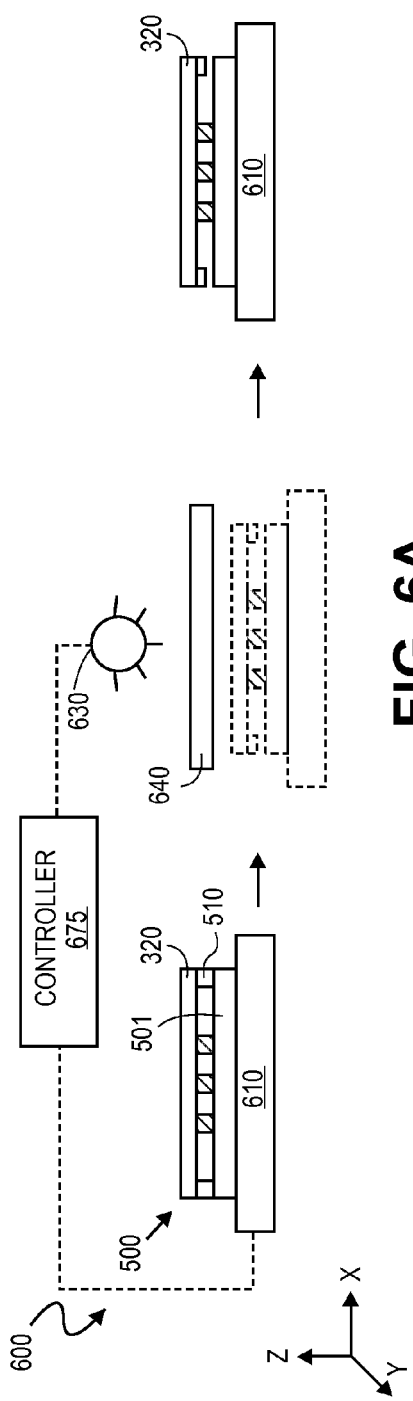
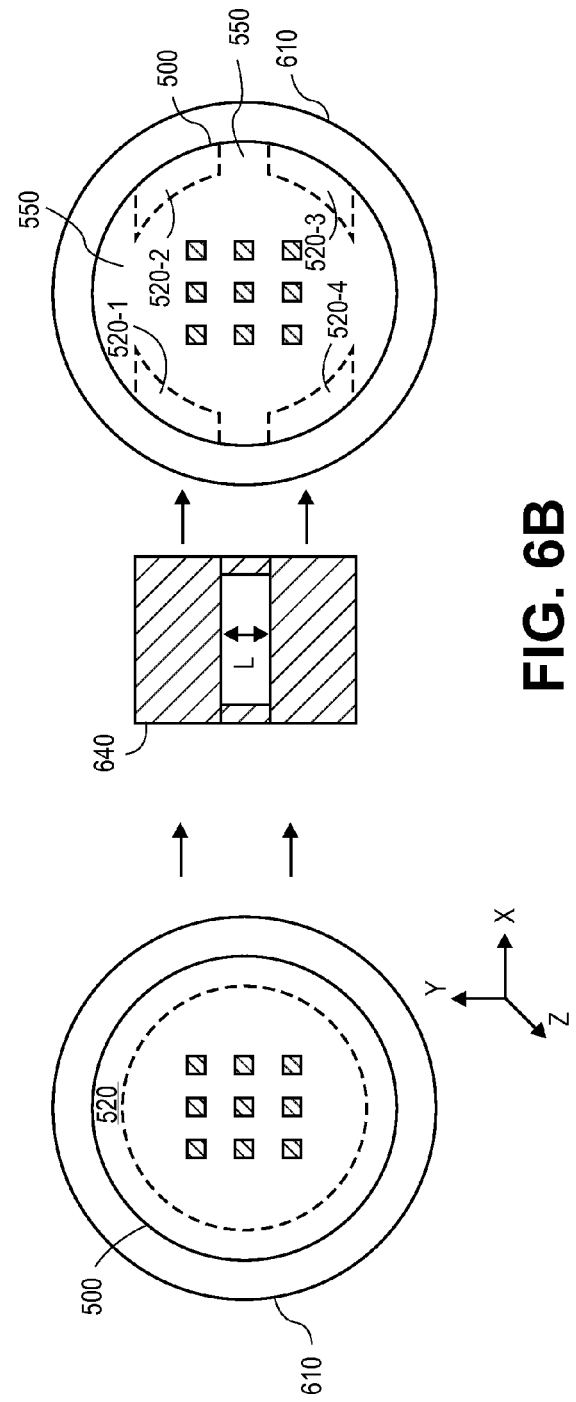

LOW TEMPERATURE THIN WAFER BACKSIDE VACUUM PROCESS WITH BACKGRINDING TAPE

CROSS-REFERENCE TO RELATED APPLICATION

This application is a U.S. National Phase application under 35 U.S.C. §371 of International Application No. PCT/US2011/054023, filed Sep. 29, 2011, entitled LOW TEMPERATURE THIN WAFER BACKSIDE VACUUM PROCESS WITH BACKGRINDING TAPE.

TECHNICAL FIELD

Embodiments of the present invention generally relate to microelectronic fabrication and more particularly to backside vacuum processing of thin substrates.

BACKGROUND

Microelectronics fabrication is conventionally performed on a bulk substrate, often referred to as a wafer. Bulk substrate thicknesses are typically 700-800 µm (microns) for the most common silicon wafer. Advanced packaging applications, such as thin die, thin thermal interface material (TDTT), 3DIC (i.e., chip stacking), etc. utilize substrates thinned to below 400 µm. After wafer thinning, vacuum processing may be performed. For example, copper and/or other metals may be deposited onto the wafer backside during a backside metallization (BSM) process to form thermal contacts, or to form copper bumps, under bump metallization (UBM), etc., electrically connecting to the microelectronic devices. Depending on the metals and thickness of the BSM, the BSM deposition process (e.g., sputtering) often elevates the wafer temperature (e.g., to 150° C.-300° C., or more).

One of the many manufacturing issues with such thin substrates is how to perform vacuum processing such as the BSM deposition. Many rigid carrier solutions, referred to collectively as wafer support systems (WSS), have been proposed where, for example a rigid glass disc, or silicon carrier wafer is attached to the thinned wafer. While some of these solutions are compatible with the elevated processing temperatures, they all suffer from complexity and attendant high cost.

Another proposed solution is to employ the backside grind (BG) tape that is applied to the wafer frontside during a back grind (BG) process as a means of support and handling during the vacuum processing. However, such tape is typically lacks stiffness sufficient for support, and to keep the BG tape adhesive from thermally decomposing at elevated processing temperatures, such as those during BSM deposition, substrate cooling is applied during the vacuum process. While this may in theory be accomplished via an electrostatic chuck (ESC) to hold the BG tape and thin wafer onto a cooled chuck in a vacuum system, because such electrostatic force is a function of distance between the thin wafer and the chuck, it is difficult in practice to keep the frontside of the wafer uniformly close to the chuck. Because air is often unavoidably, or deliberately, entrapped between the BG tape and frontside topologies (frontside bumps, etc.), air bubbles form between the BG tape and the frontside of the wafer, become large under vacuum, and increase thermal resistance between the cooled chuck and wafer. Such air bubbles can lead to significant thermal gradients and localized wafer bowing, either of which can ultimately cause breakage of the wafer during the vacuum process and a complete loss of hundreds, if not thousands, of fully fabricated microelectronic devices.

A low temperature thin wafer vacuum process overcoming these issues is therefore advantageous for BSM deposition and other similarly demanding vacuum processes.

BRIEF DESCRIPTION OF THE DRAWINGS

Embodiments of the present invention are illustrated by way of example, and not limitation, in the figures of the accompanying drawings in which:

FIGS. 6A and 6B illustrate plan and side view schematics of a UV cure apparatus to perform a pre-cure operation of the BSM method in FIG. 2, in accordance with an embodiment;

DETAILED DESCRIPTION

In the following description, numerous details are set forth, however, it will be apparent to one skilled in the art, that embodiments of the present invention may be practiced without these specific details. In some instances, well-known methods and devices are shown in block diagram form, rather than in detail, to avoid obscuring embodiments of the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Figure 1:
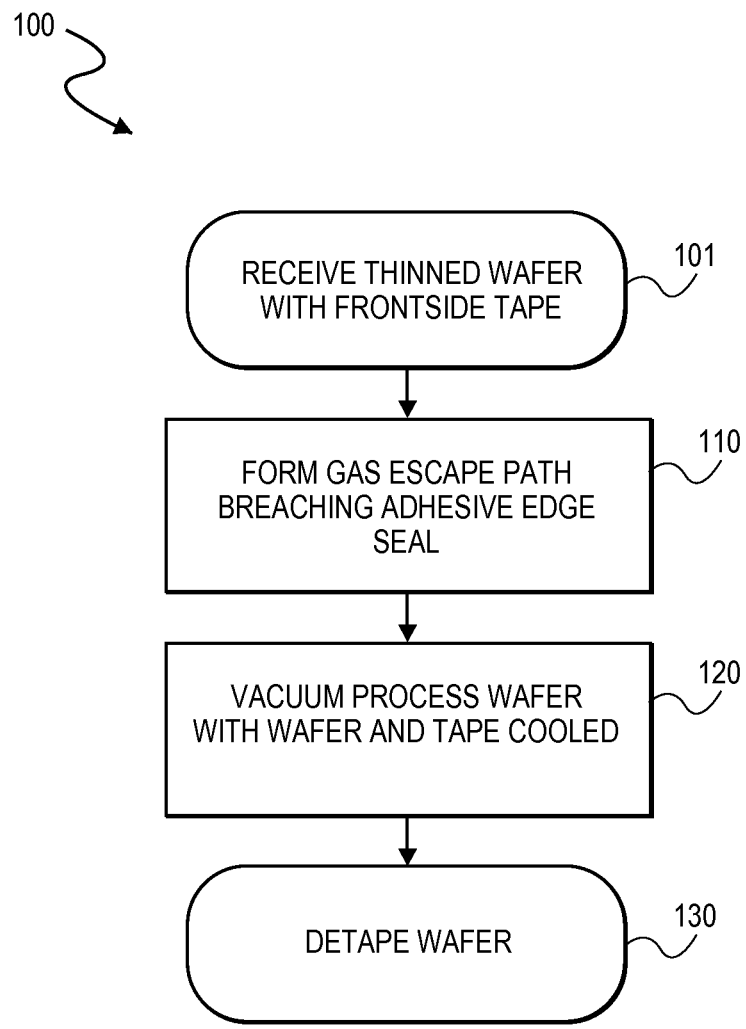
FIG. 1 is a flow diagram illustrating a backside vacuum processing method, in accordance with an embodiment of the present invention.
Figure 2:
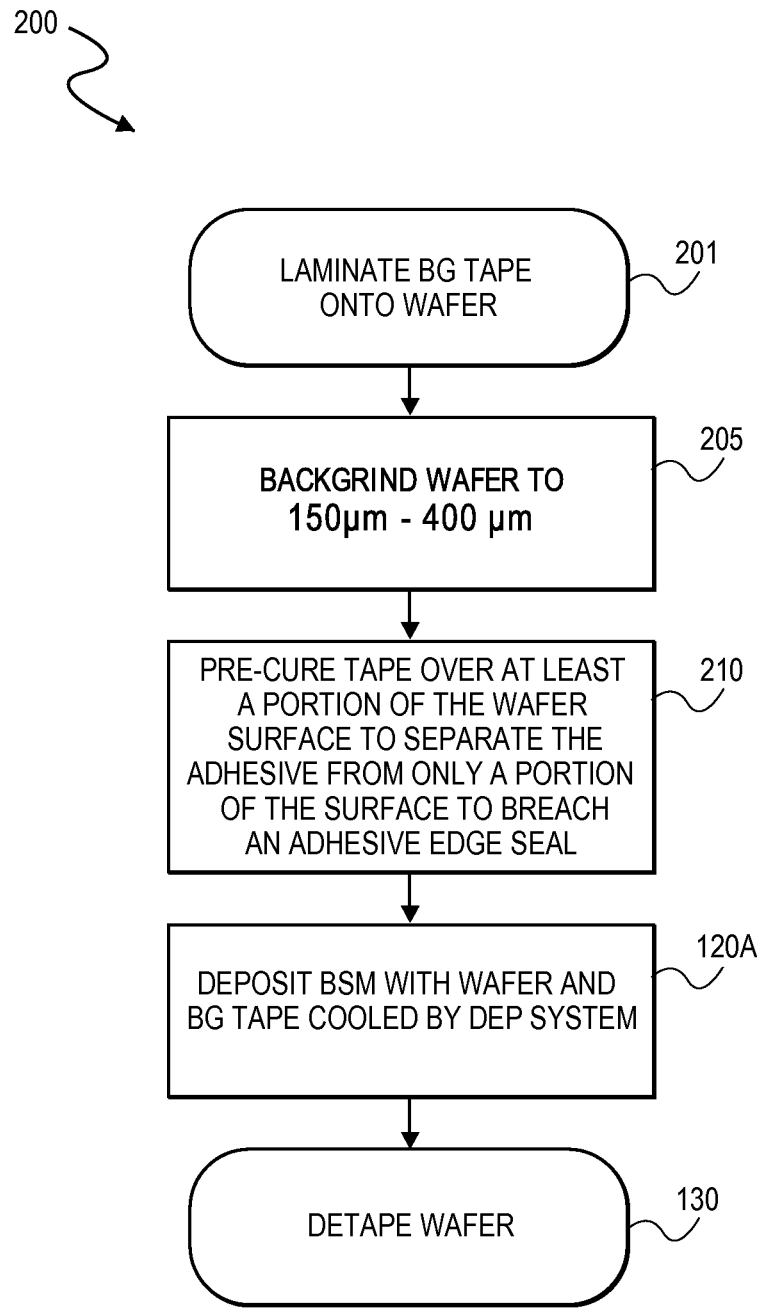
FIG. 2 is a flow diagram illustrating a BSM method, in accordance with an embodiment of the present invention.

FIG. 1 is a flow diagram illustrating a backside vacuum processing method 100, in accordance with an embodiment of the present invention. The method 100 begins at operation 101 with a thinned wafer having tape laminated to a frontside of a wafer. FIG. 2 is a flow diagram further illustrating a BSM method 200 in accordance with an embodiment of the present invention that is inclusive of tape application at operation 201 and backgrinding of the wafer at operation 205 to arrive at a material suitable for using in operation 101 of method 100.

Figure 3A:
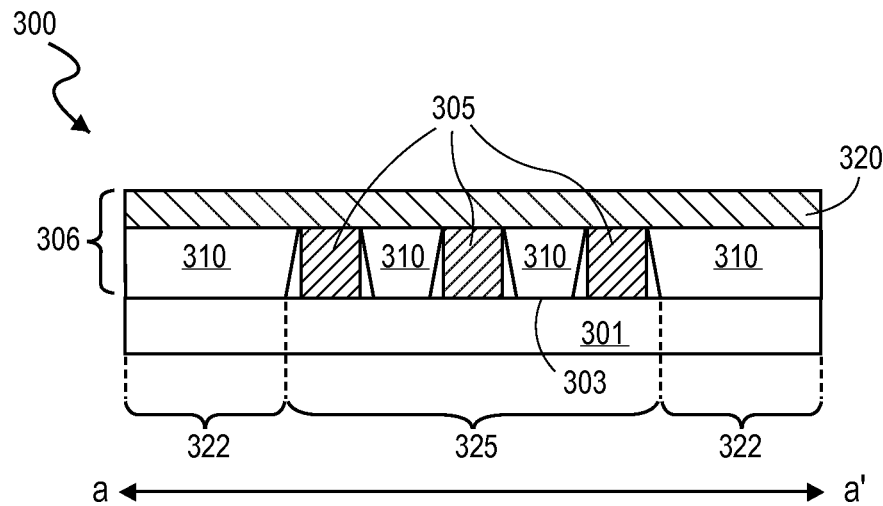
FIGS. 3A, 3B, and 3C illustrate cross-sectional and plan views of a taped wafer as it is processed through certain operations of the method of FIG. 1 or FIG. 2, in accordance with an embodiment.
Figure 3B:
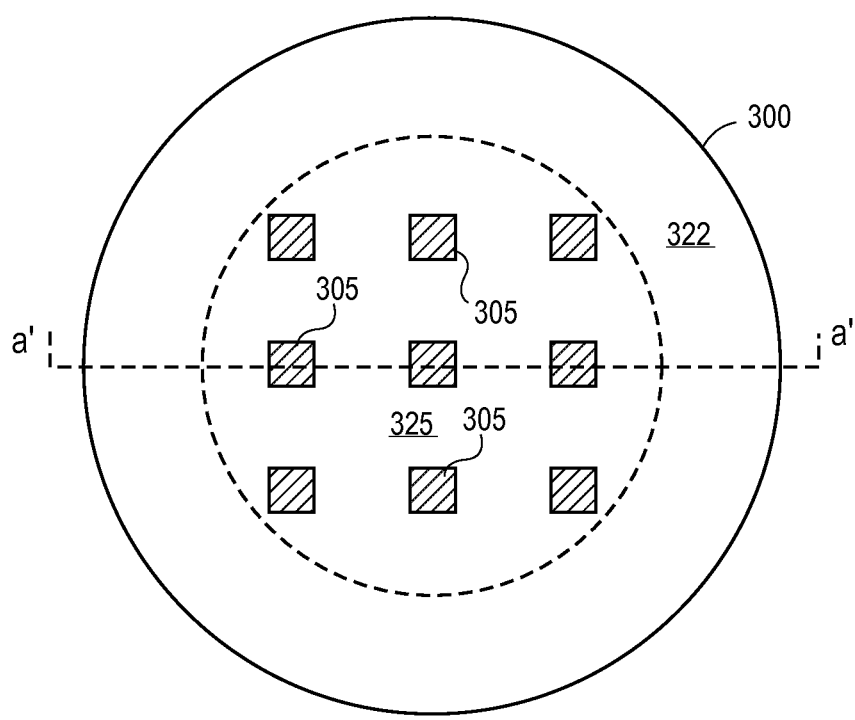
Figure 3C:
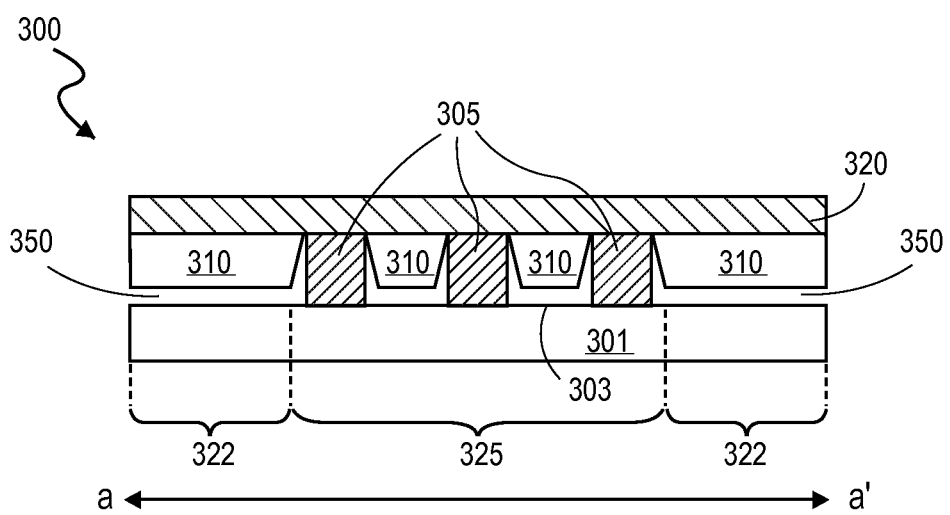

FIGS. 3A, 3B, and 3C illustrate cross-sectional and plan views of a taped wafer 300 as it is processed through certain operations of the processes of FIG. 1 or FIG. 2, in accordance with an embodiment. Referring to FIG. 3A, the thin wafer 301 has frontside topography 305, for example metallization such as copper bumps, pads, etc., which may for example extend 10-40 µm, or more, from a nominal frontside surface where each of a plurality of microelectronic devices (not illustrated) are fabricated on the thin wafer 301. Generally, the microelectronic devices may be any integrated circuit and embodiments of the present invention are not limited in this respect. Exemplary microelectronic devices include memory, such as, but not limited to, dynamic random access memory (DRAM,) non-volatile random access memory (NVRAM), NOR and NAND flash memory, etc., microprocessors, application specific integrated circuits (ASICs), floating point gate arrays (FPGA), etc., optical devices, such as light emitting diodes (LEDs), active pixel sensors (APS), and Microelectromechanical systems (MEMS). While the thinned wafer 301 may generally be of any material suitable for semiconductor device fabrication, in advantageous embodiments it is composed of a single crystalline material such as, but is not limited to, silicon, germanium, silicon-germanium, or a III-V compound semiconductor material. The thin wafer 301 may also be a semiconductor (silicon) on insulator (SOI) substrate having a buried insulator layer (e.g., silicon dioxide) spanning the entire area of the thin wafer 301, as known in the art.

In an embodiment, the thin wafer 301 (e.g., following operation 205) is to have a thickness below 400 µm but sufficiently thick that a rigid support (e.g., WSS) is not structurally required for vacuum processing (e.g., BSM deposition). In other words, the thin wafer 301 is of sufficient thickness that when combined with a semi-rigid support, somewhat more rigid that conventional BG tape, BSM processing is possible with commercially available robotic handling and wafer clamping means. In exemplary embodiments, the thin wafer 301 is between 150 µm and 400 µm thick and advantageously between 150 µm and 250 µm thick.

Laminated to a frontside of the thin wafer 301 is a frontside tape 306, such as the backgrind (BG) tape attached at operation 201 in FIG. 2 to facilitate the backgrind operation 205. The frontside tape 306 includes a base film 320 and an adhesive 310. In the exemplary embodiment, the base film 320 has sufficient stiffness to serve as the semi-rigid support of the thin wafer 301. In other words, no rigid support ring or other mechanical means is further provided in addition to the frontside tape 306 to support the thin wafer 301 during vacuum processing (e.g., BSM deposition). As stiffness is an extensive material property, either thickness or composition of the base film 320 may be selected to achieve the stiffness needed for a particular combination of wafer thickness and vacuum processing equipment.

As one exemplary embodiment, the base film 320 is ethylene vinyl acetate (EVA). For such an embodiment, semi-rigidity may be provided by increasing the thickness of the EVA base film 320 beyond that of conventional BG tape, for example to at least 300 µm for those embodiments where the thin wafer 301 has a thickness of around 200 µm. Thicknesses much beyond about 400 µm should not be necessary for an EVA base film 320 unless the thin wafer 301 has a thickness significantly below 200 µm (e.g., 150 µm). For embodiments employing a stiffer base material, base film thickness may be corresponding less. In another embodiment for example, the base film 320 is polyethylene (PET) of at least 100 µm thick where the thin wafer 301 has a thickness of around 200 µm. Notably, while thinner than the exemplary EVA embodiments, the PET embodiments are still two to three times the thickness of conventional BG tape having a PET base film. Thicknesses much beyond about 200 µm should not be necessary for a PET base film 320 unless the thin wafer 301 has a thickness significantly below 200 µm (e.g., 150 µm).

Depending on the class of frontside tape, the adhesive 310 may be uniformly dispersed over the entire surface area of the tape, as illustrated in FIG. 3A. In alternative embodiments, frontside tape adhesive is non-uniformly dispersed, as illustrated by adhesive 410 in FIG. 4A and adhesive 510 in 5A. For all classes of frontside tape however, the adhesive forms an edge seal to protect the previously fabricated frontside structures (e.g., topographic features 305 and associated microelectronic devices) from external contaminants, such as backgrind slurry and debris generated during wafer thinning. In embodiments, the adhesive 310 is a UV-curable composition.

Figure 4A:
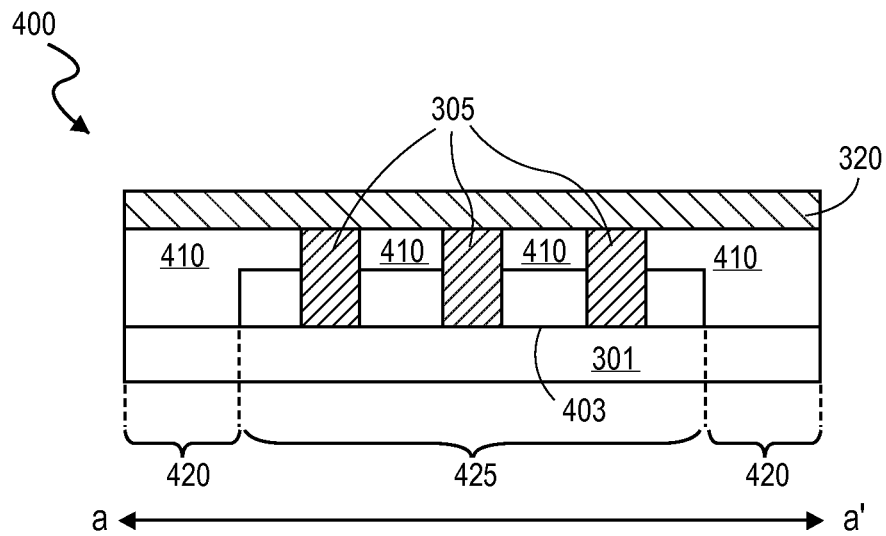
FIGS. 4A, 4B, 4C, 4D, 4E, and 4F illustrate cross-sectional and plan views of a taped wafer as it is processed through certain operations of the method of FIG. 1 or FIG. 2, in accordance with an embodiment.
Figure 4B:
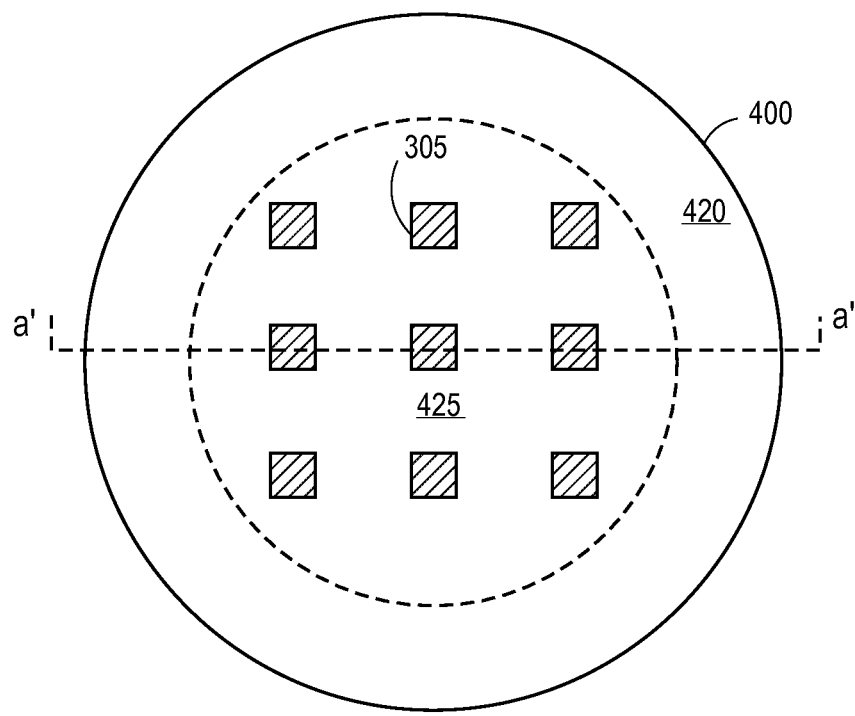
Figure 5A:
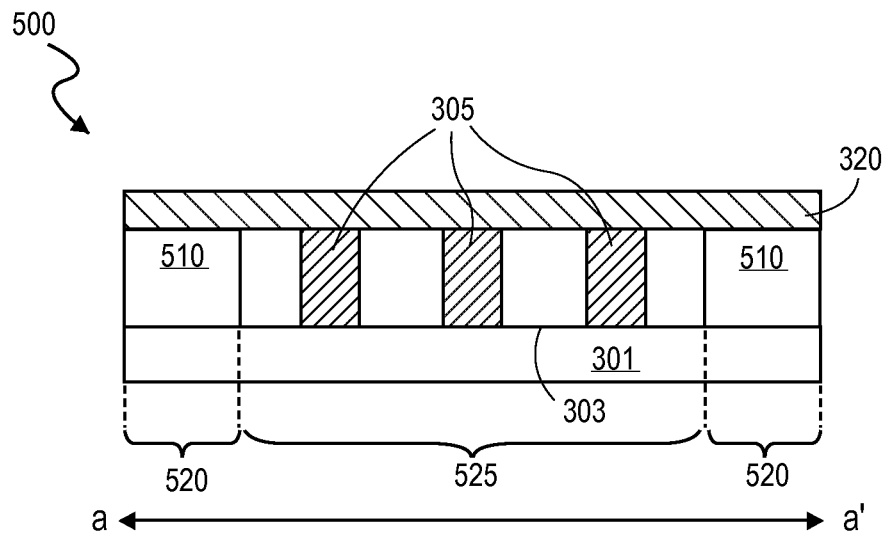
FIGS. 5A, 5B, 5C, 5D, 5E, and 5F illustrate cross-sectional and plan views of a taped wafer as it is processed through certain operations of the method of FIG. 1 or FIG. 2, in accordance with an embodiment.
Figure 5B:
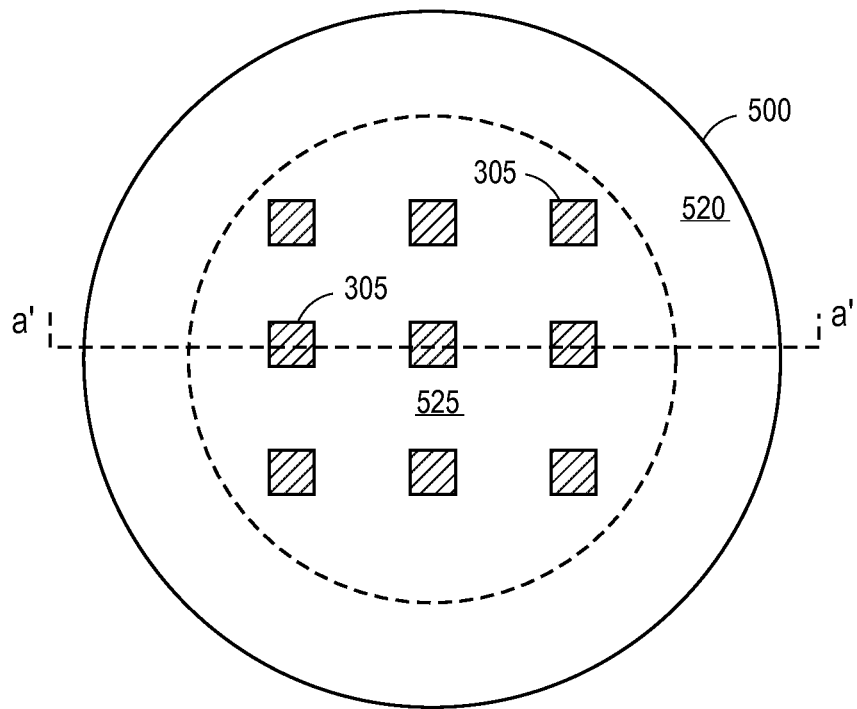

Referring first to FIG. 3A, for a first class of tape the adhesive 310 fully encapsulates the topographic features 305 such that the adhesive 310 contacts the thin wafer 301 even at a base 303 between two adjacent topographic features 305. As shown in cross-section in FIG. 3A, and as also shown in plan view by FIG. 3B, the adhesive 310 forms a continuous edge seal 322 at the wafer edge surrounding a frontside interior surface region 325 of the wafer (i.e., internal to the edge seal 322). Shown in FIG. 4A is a second class of taped wafer 400 where the adhesive 410 only partially encapsulates the topographic features 305 such that the adhesive 410 is not present at the base 303 between two adjacent topographic features 305. Nevertheless, as shown in cross-section in FIG. 4A, and as also shown in plan view by FIG. 4B, the adhesive 410 forms a continuous edge seal 420 at the wafer edge surrounding a frontside interior surface region 425 of the wafer (i.e., internal to the edge seal 420). Shown in FIG. 5A is a third class of taped wafer 500, often referred to as no-residue-tape (NRT), where the adhesive 510 encapsulates no portion of the topographic features 305. Again however, as shown in cross-section in FIG. 5A, and as also shown in plan view by FIG. 5B, the adhesive 510 is present to the extent necessary to form a continuous edge seal 520 at the wafer edge (i.e., at a perimeter of the base film 320) surrounding a frontside interior surface region 525 of the wafer (i.e., internal to the edge seal 522).

Returning to FIG. 1, at operation 110, a gas escape path is formed to breach the edge seal formed by the adhesive on the frontside tape. FIG. 3C illustrates a gas escape path 350 along the a-a' cross-section line that is formed into a fully encapsulating tape embodiment. As shown, along the gas escape path 350, the adhesive 310 between the base film 320 and the frontside surface of the thin wafer 301 is separated. The gas escape path 350 however places the wafer frontside interior surface region 325 internal to the edge seal 322 in fluid communication with environments external to the edge seal 322 while retaining the protective physical barrier over the frontside microelectronic device and topographic features 305 and while retaining support of the thinned wafer provided by the semi-rigid base film 320. As the gas escape path 350 is formed after wafer thinning, there is little concern for frontside contamination. With the gas escape path 350 formed, the taped thin wafer has sufficient rigidity to be processed under vacuum conditions with fabrication equipment conventionally utilized for full thickness wafers or rigidly supported wafers without significant bubbling of the frontside tape.

In an embodiment, and as further illustrated in FIG. 2, a gas escape path may be formed by pre-curing the tape at operation 210 over at least a portion of the frontside surface area of a thin wafer to separate the adhesive from only a portion the wafer frontside. The pre-curing may entail any conventional curing technique typically utilized for detape based on the particular adhesive chosen. In certain embodiments, exposure dose and time is sufficient for complete, full curing of the adhesive (i.e., no further desirable change with additional cure time).

Referring to FIG. 3A where the frontside topography 305 is fully encapsulated by the adhesive 310, the entire frontside surface area may be exposed to UV radiation (i.e., irradiated) to separate the adhesive 310 from the wafer frontside at the edge seal 322 while maintaining adhesive contact with the topographic features 305, as further shown in FIG. 3C. It has been found that although shrinkage of the adhesive 310 upon UV cure will open the edge seal and also a network of gas escape paths throughout the frontside surface (e.g., at the base 303 between two adjacent topographic features 305) that extend into the wafer frontside interior surface region 325, sufficient contact is maintained with the frontside topography 305 for the frontside tape to serve as the semi-rigid support during subsequent vacuum processing (e.g., BSM deposition).

Figure 4C:
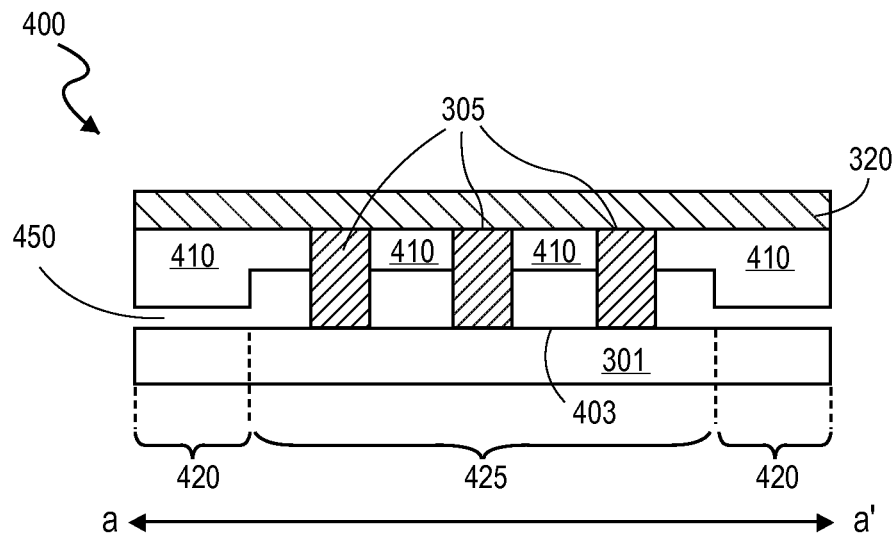
Figure 4D:
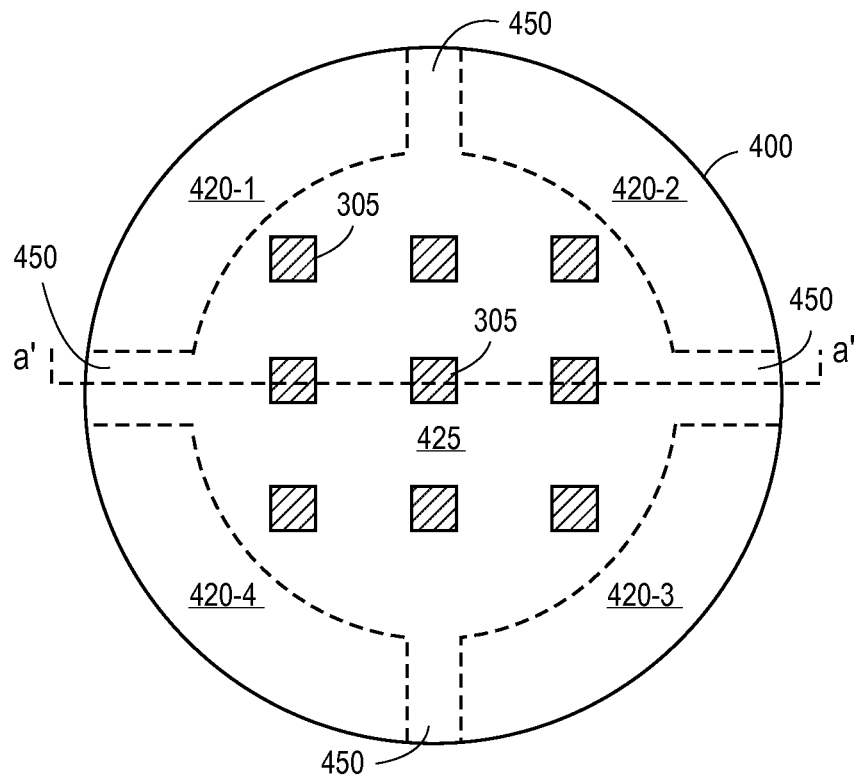
Figure 4E:
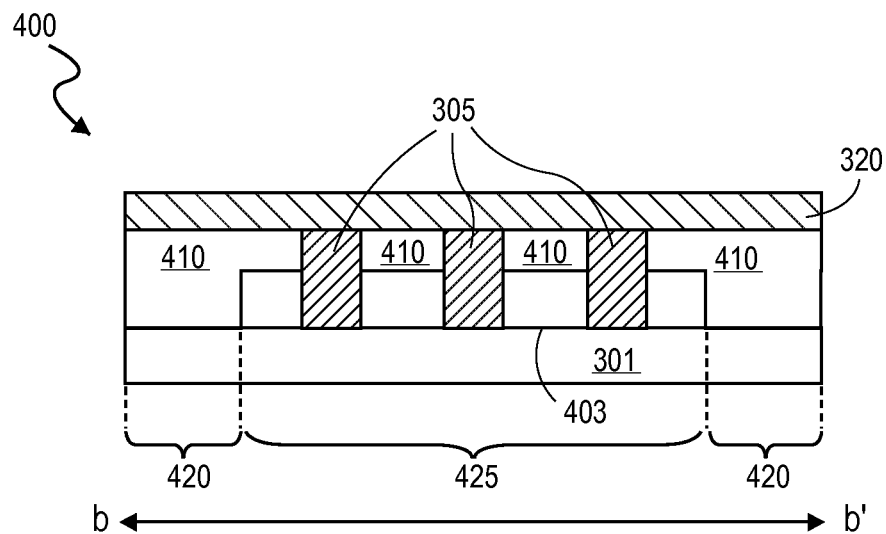
Figure 4F:
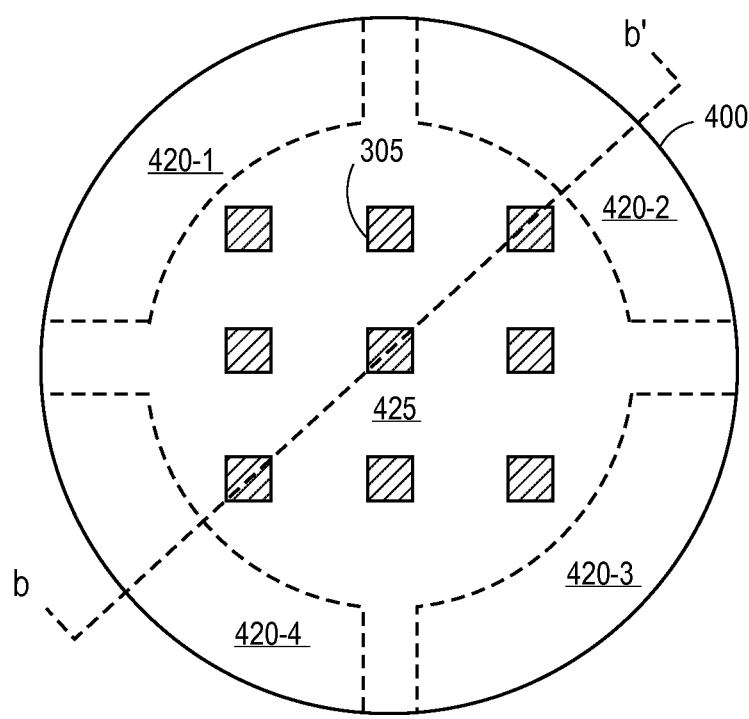
Figure 5C:
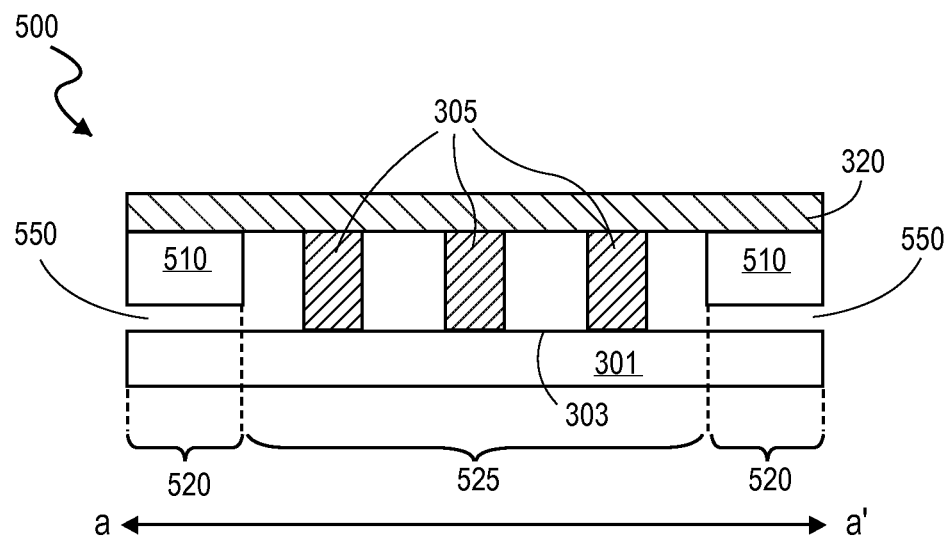
Figure 5D:
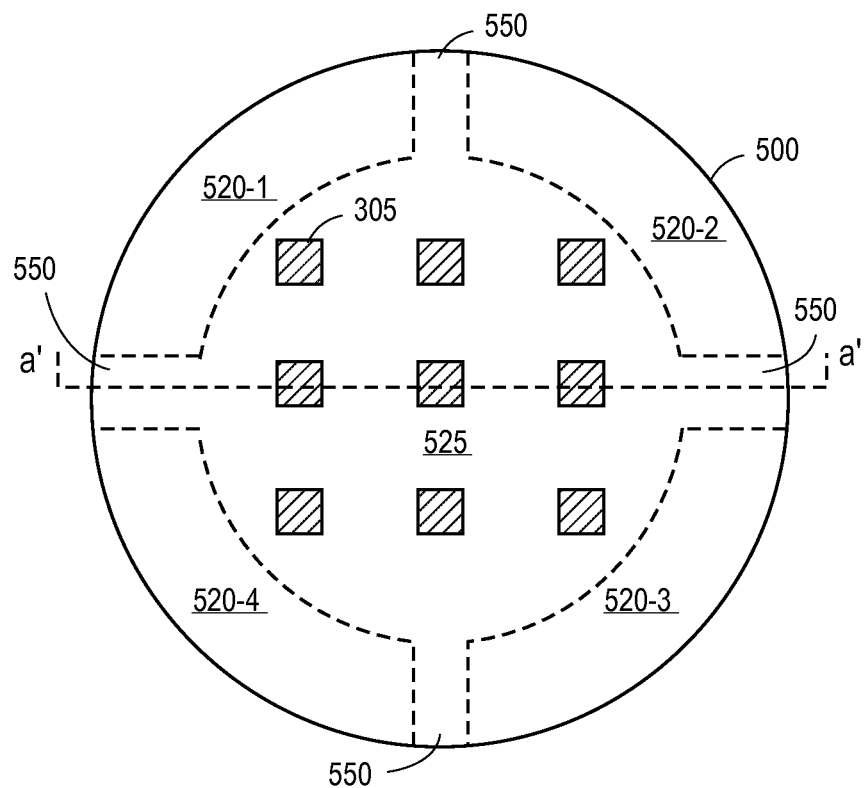
Figure 5E:
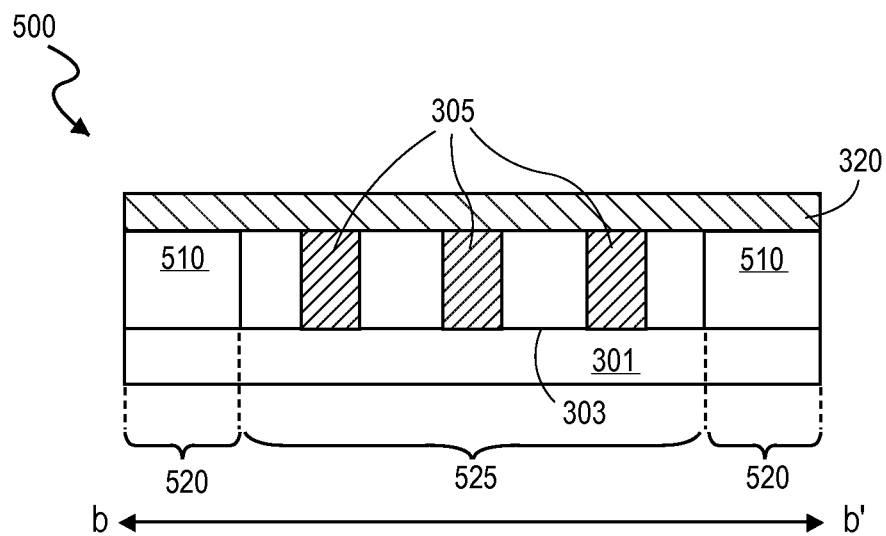
Figure 5F:
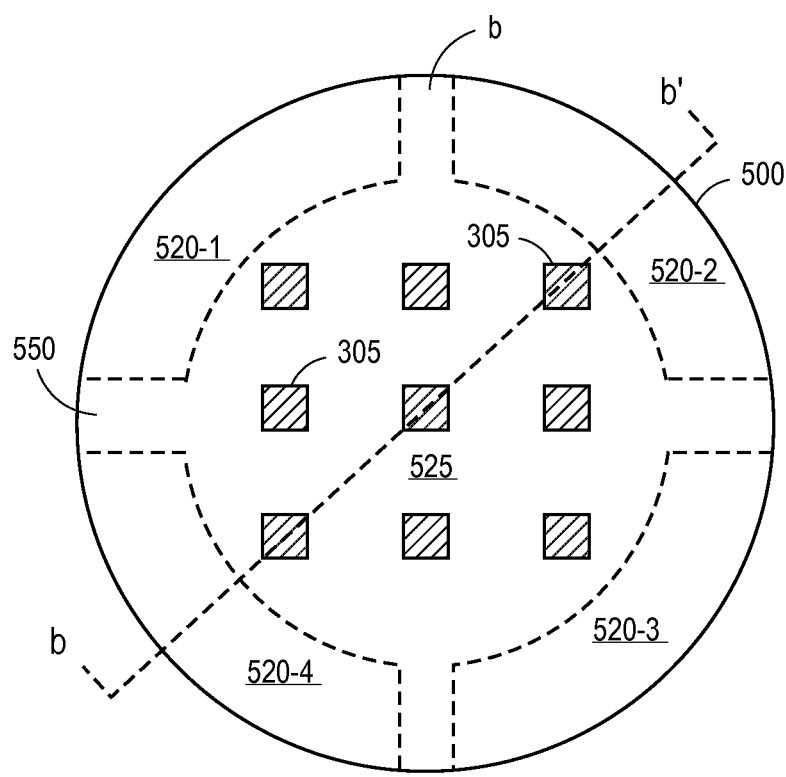

Referring to FIGS. 4C and 5C, where the frontside topographic features 305 are either only partially encapsulated or unencapsulated, respectively, pre-curing of the frontside tape at operation 210 entails selectively forming escape paths between retained portions of an adhesive edge seal. For example as shown in FIG. 4C, edge seal portions 420-1, 420-2, 420-3 and 420-4 are separated by intervening escape paths 450. As illustrated in FIGS. 4E and 4F, between the gas escape paths 450, the edge seal portions 420-1, 420-2, 420-3 and 420-4 remain adhered to the thin wafer 301 and provide support to the thinned wafer. As further illustrated in FIGS. 5E and 5F, for NRT embodiments, after the pre-cure operation 210, support of the thin wafer 301 is limited on only to the edge seal portions 520-1, 520-2, 520-3 and 520-4.

In exemplary embodiments, the escape paths 450 are formed by selectively exposing less than the entire wafer frontside surface area to UV radiation. In alternative embodiments, only portions of the adhesive are UV curable, so that the entire frontside surface of the wafer may be exposed to UV radiation during the pre-cure operation 210 (as for the fully encapsulated tape embodiment illustrated in FIGS. 3A-3C) to form a pre-determined pattern of gas escape paths. For example, gas escape paths 450 may be formed where UV-curable adhesive is utilized while UV insensitive adhesive is present in regions 420-1, 420-2, 420-3, and 420-4).

For the exemplary embodiments, the UV pre-cure is made selective to portions of the frontside area of the thin wafer 301 either by shadowing portions of the adhesive from the UV radiation with a wafer-based stencil or by scanning the thin wafer 301 under a UV source having spot size smaller than a diameter of the wafer, along a predetermined path that passes through the edge seal at one or more locations. In the first case, the wafer-based stencil may be affixed to the base film 320 before or after wafer thinning to block UV light in the edge seal portions 420-1, 420-2, 420-3, and 420-4. Similar to the embodiment where only portions of the frontside tape adhesive are UV curable, portions of the base film 320 may be made to prevent or substantially reduce UV transmission in the regions disposed over the edge seal portions 420-1, 420-2, 420-3, and 420-4 relative to the regions disposed over the escape paths 450.

A UV source utilized during the pre-cure operation 210 may also be configured to have a spot size smaller than a diameter of the thin wafer, for example through use of a stencil or shutter affixed a UV exposure apparatus between a UV source and a chamber where the wafer is pass during pre-cure, or through physically small UV sources, such as, but not limited to, commercially available LED UV sources, disposed in close proximity to the thin wafer. With a spot size less than the diameter of the thin wafer, the pre-cure operation 210 further entails directing the UV irradiation along a pre-determined path that passes through the edge seal at one or more locations.

Returning to FIG. 1, at operation 120 the vacuum processing is then performed. In embodiments where such processing is at elevated temperatures, the wafer and pre-cured frontside tape cooled to below 90° C. As further shown in FIG. 2, vacuum processing operation 120 entails a BSM deposition 120A with the wafer and pre-cured frontside tape cooled by the BSM deposition system. For example, the pre-cured tape may be disposed on an electrostatic chuck (i.e., base film 320 facing the ESC) and cooled to below 90° C. (e.g., 5-15° C.). A voltage may be applied to the chuck to electrostatically clamp the thin wafer 301 to the chuck while the BSM is sputtered onto the wafer backside while maintaining the adhesive at a temperature below 90° C. While the composition of the BSM metal or stack of metals may be any known in the art, in the exemplary embodiment the BSM deposited at operation 120A includes a metal which is deposited at sufficient power that without wafer cooling, the adhesive would reach temperatures of at least 175° C. For example, in one embodiment, BSM deposition entails depositing a thickness of nickel vanadium (NiV) that induces wafer temperatures over 175° C.

Following vacuum processing (e.g., BSM deposition), the frontside tape is removed at the detape operation 130. Typically at operation 120, the thin wafer is mounted to dicing tape applied to the wafer backside. In embodiments, the detape operation 130 further entails curing any un-cured portions of the frontside tape to separate the adhesive from the entire wafer frontside surface area. For example, in FIG. 5C edge seal portions 520-1, 520-2, 520-3, and 520-4 may be cured using standard techniques for the NRT class of BG tape. For embodiments, where a full cure was done at the pre-cure operation (e.g., 210), no further cure is performed at the detape operation 130. Following the detape operation 130, conventional die prep activities may then be performed.

FIGS. 6A and 6B illustrate plan and side view schematics of a UV cure apparatus 600 to perform at least the pre-cure operation 210 of the BSM method 200, in accordance with an embodiment.

The UV cure apparatus 600 includes a robotic handler 610 upon which the thin wafer 301, as supported by the top side tape (for example including the base film 320 and adhesive 510) is disposed during the pre-cure operation 210. The robotic handler 610 may be any stage, platen, chuck, etc. utilized in a conventional UV cure apparatus. The UV cure apparatus 600 further includes a UV source 630, such as, but not limited to a UV source emitting over any or all of the UV-A, UV-B, or UV-C wavelengths. The UV source 630 may be any source conventional for curing applications, such as, but not limited to, a lamp having a hot or cold cathode. For embodiments where the lamp emission results in an exposure length that is at least the diameter of the thin wafer 301, the UV cure apparatus 600 includes a stencil, or shutter, 640 to reduce the UV illuminated spot size to a dimension, L, along at least one dimension (e.g., the y-dimension in FIGS. 6A and 6B). The reduced spot size dimension L is significantly less than the diameter of the thin wafer 301 for which the robotic handler 610 is configured to support (e.g., less than 300 mm). In exemplary embodiments, L is on the order of tens of millimeters.

The UV cure apparatus 600 further includes a controller 675 communicatively coupled to the robotic handler 610, to the UV source 630, and potentially to the shutter 640, to selectively irradiate a path through an adhesive edge seal at predetermined locations about a perimeter of the tape as the wafer 501 displaced relative the UV source 630 by the robotic handler 610. As shown in the FIGS. 6A and 6B, a single-pass scan of the wafer 501 in the x-dimension may be performed twice with the robotic handler 610 rotating the wafer 501 approximately 90° between the two scans. Therefore, the adhesive edge seal 520 is bifurcated into four edge seal portions 520-1, 520-2, 520-3, and 520-4 with the gas escape path 550 disposed there between. Widths of the gas escape paths 550 are therefore on the order of the spot size dimension L (e.g., tens of millimeters) while the four edge seal portions 520-1, 520-2, 520-3, and 520-4 have arc lengths along the wafer edge that are one hundred millimeters, or more.

Figure 7A:
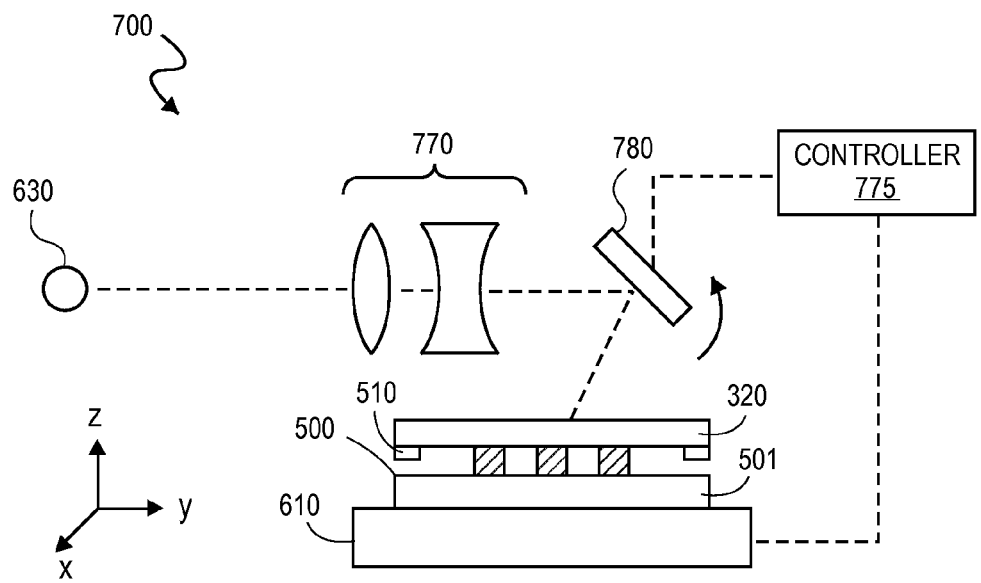
FIGS. 7A and 7B illustrate plan and side view schematics of a UV cure apparatus to perform a pre-cure operation of the BSM method in FIG. 2, in accordance with an embodiment.
Figure 7B:
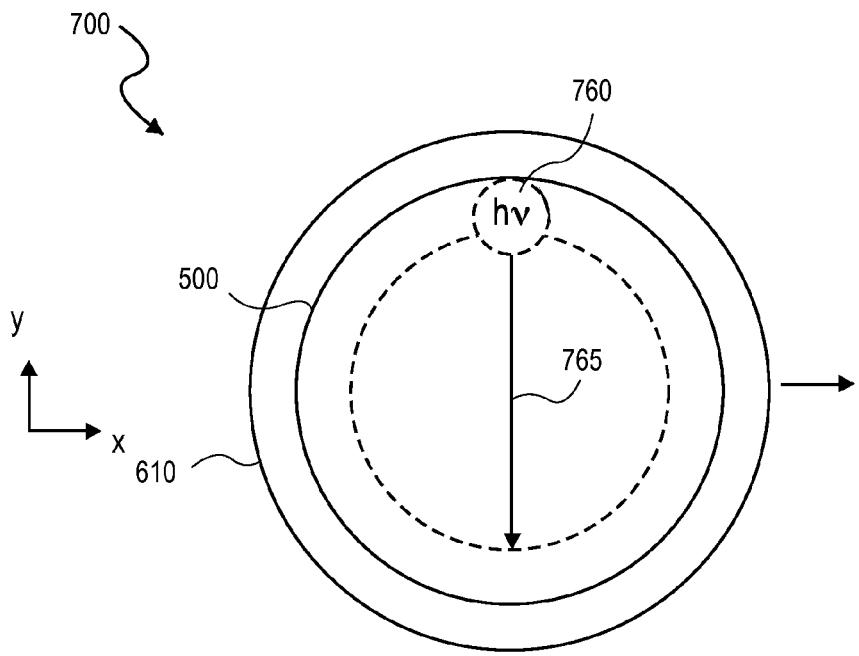

FIGS. 7A and 7B illustrate plan and side view schematics of a UV cure apparatus 700 to perform at least the pre-cure operation 210 of the BSM method 200, in accordance with an embodiment. The UV cure apparatus 700 includes the robotic handler 610 and the UV source 630 (e.g., laser, lamp, etc.). In the optical path between the UV source 630 and the wafer 501 is a beam steering apparatus 780, such as a galvanometer driven mirror. One or more of the robotic handler 610, UV source 630 and beam steering apparatus 780 is communicatively coupled to a controller 775 programmed to automatically direct UV radiation along a predetermined path on the frontside surface of the wafer 501 that irradiates a path through an adhesive edge seal at predetermined locations about a perimeter of the tape. In further embodiments, spot size may be controlled through optical elements 770 conventional to the imaging arts, depending on the desired width of the gas escape paths to be scanned. In the exemplary embodiment, the UV source 630 is to irradiate a spot size having a diameter less than a diameter of the wafer 501 and the spot is to be displaced relative to the wafer in both an x and y dimension across the frontside surface area. As further illustrated in FIG. 7B, the robotic handler 610 displaces the wafer 501 relative to an illuminated spot 760 along a first dimension (e.g., x-dimension) while the beam steering apparatus 780 displaces the illuminated spot 760 relative to the wafer 501 along a second dimension (e.g., y-dimension). Of course, alternative embodiments where either one of the robotic handler 610 or beam steering apparatus 780 induces displacement in both x and y dimensions are also possible.

Figure 8:
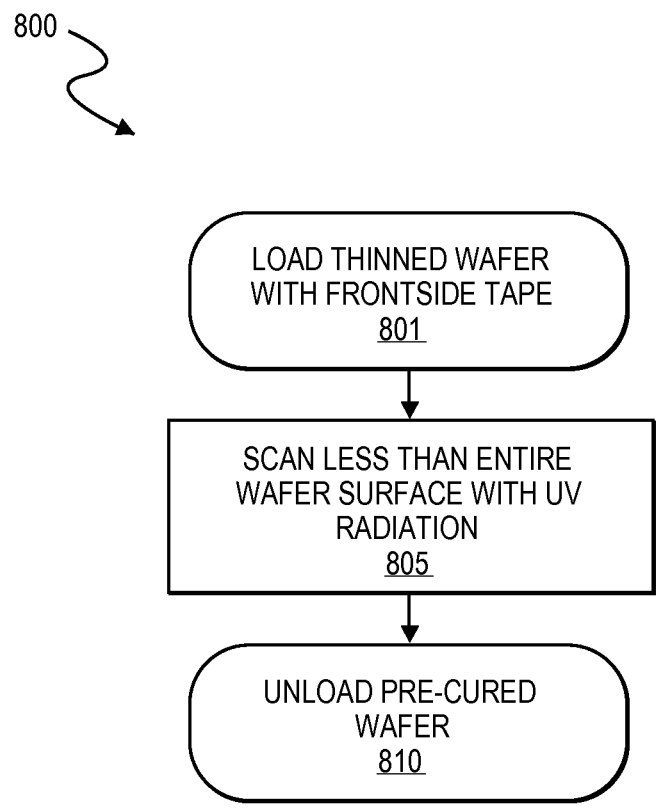
FIG. 8 is a flow diagram illustrating a frontside tape pre-cure method, in accordance with an embodiment of the present invention.

FIG. 8 is a flow diagram illustrating a frontside tape pre-cure method 800, in accordance with an embodiment of the present invention. The pre-cure method 800 may be performed by a UV cure apparatus, such as, but not limited to the UV cure apparatus 600 or the UV cure apparatus 700. Method 800 begins at operation 801 with loading the thinned and taped wafer (e.g., wafer 501) into the pre-cure apparatus. At operation 805, a path is irradiated through an adhesive edge seal at predetermined locations about a perimeter of the tape. One or more gas escape paths are thereby formed through a radial thickness of an adhesive edge seal to place an interior area of the frontside tape in fluid communication with the environment external to the adhesive edge seal. The wafer is then unloaded from the pre-cure apparatus for subsequent vacuum processing (e.g., sputter deposition of a BSM).

Figure 9:
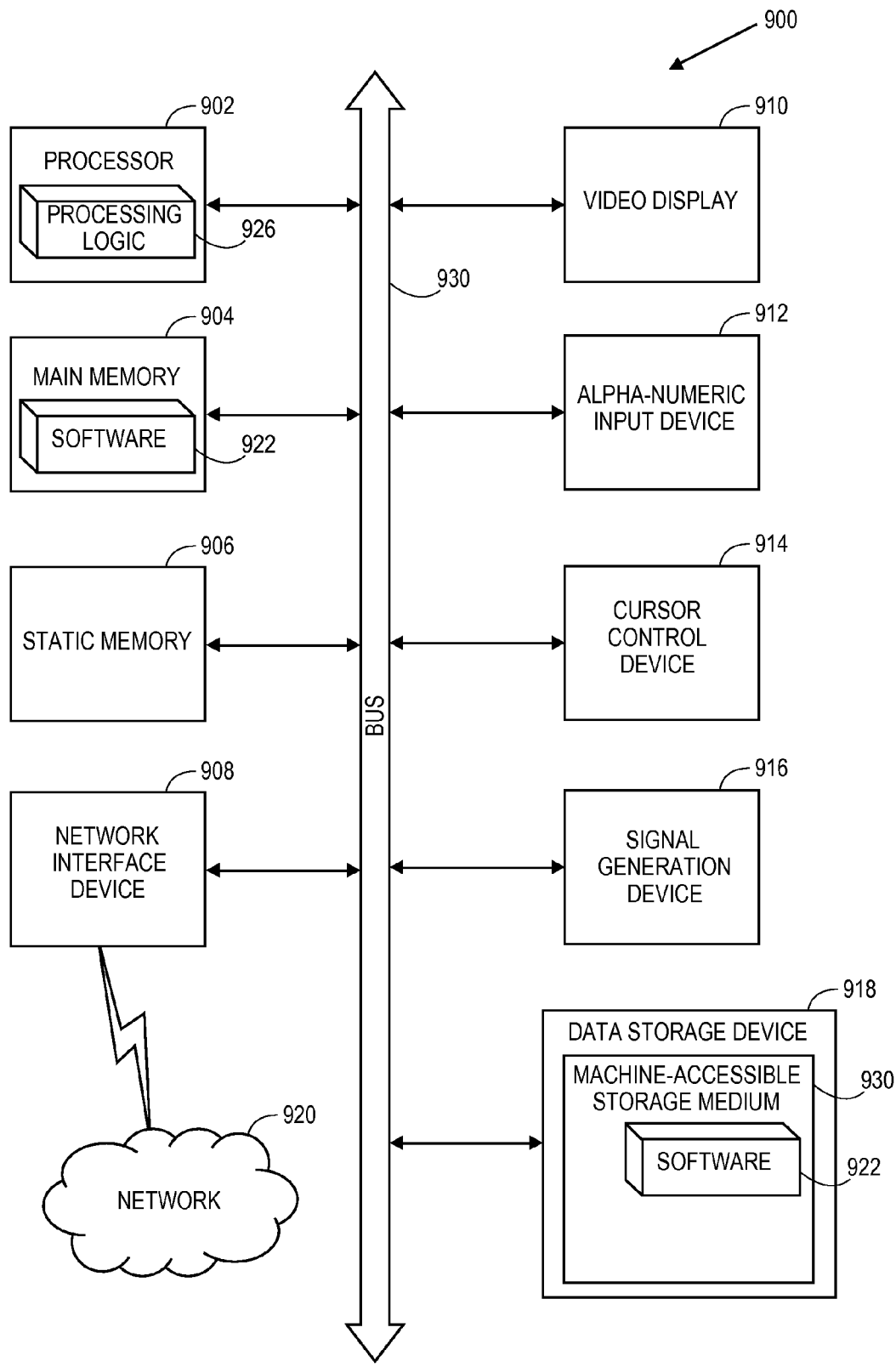
FIG. 9 is a block diagram of a computer system configured to perform the frontside tape pre-cure method illustrated in FIG. 8, in accordance with an embodiment of the present invention.

FIG. 9 is a block diagram of a computer system 900 configured as a controller (e.g., controller 675 or 775) to cause the UV cure apparatus to perform the frontside tape pre-cure method illustrated in FIG. 8, in accordance with an embodiment of the present invention. The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

Processor 902 represents one or more general-purpose processing devices such as a microprocessor, central processing unit, or the like. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations and steps discussed herein.

The computer system 900 may further include a network interface device 908. The computer system 900 also may include a video display unit 910 (e.g., a liquid crystal display (LCD)), an alphanumeric input device 912 (e.g., a keyboard), a cursor control device 914 (e.g., a mouse), and a signal generation device 916 (e.g., a speaker). The secondary memory 918 may include a machine-accessible storage medium (or more specifically a computer-readable storage medium) 930 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 920 via the network interface device 908.

The machine-accessible storage medium 930 may also be used to stored control commands for one or more of the UV source 930 and robotic handler 610. In an embodiment, machine-accessible storage medium 931 may be used to configure the processor 902 to expose less than an entire frontside surface area of a wafer having frontside tape to form gas escape paths. While the machine-accessible storage medium 930 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodological embodiments of the present invention. The term "machine-readable storage medium" shall accordingly be taken to include, but not be limited to, solid-state memories, optical and magnetic media, and other similar non-transitory formats.

It is to be understood that the above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A backside vacuum processing method, comprising:
   laminating a tape to a frontside of the wafer wherein the tape includes a base film and an adhesive;
   backgrinding a backside of the wafer, the backside opposite the frontside;
   forming a gas escape path on the wafer wherein forming the gas escape path breaches an edge seal formed by the adhesive to place the wafer frontside internal to the edge seal in fluid communication with an environment external to the edge seal, wherein the forming the gas escape path occurs after laminating the tape to the wafer and after backgrinding the backside of the wafer;
   vacuum processing the wafer with the tape disposed on a chuck of a vacuum processing apparatus; and
   removing the tape.

2. The method of claim 1, wherein the vacuum processing comprises depositing a backside metallization (BSM) with the wafer and the tape cooled by a BSM deposition system.

3. The method of claim 1, wherein forming the escape path further comprises pre-curing the tape over at least a portion of the wafer frontside surface area to separate the adhesive from only a portion the wafer frontside.

4. The method of claim 3, wherein the wafer frontside includes topographic features, and wherein pre-curing the tape over at least a portion of the wafer frontside area further comprises exposing the entire frontside surface area to UV radiation to separate the adhesive from the wafer frontside at the edge seal while maintaining adhesive contact with the topographic features.

5. The method of claim 3, wherein the pre-curing of the tape comprises selectively exposing less than the entire wafer frontside surface area to UV radiation.

6. The method of claim 5, wherein selectively exposing less than the entire wafer frontside surface area to UV radiation further comprises at least one of: shadowing portions of the adhesive from the UV radiation with a stencil; or scanning the wafer under a UV source having spot size smaller than a diameter of the wafer, along a predetermined path that passes through the edge seal at one or more locations.

7. The method of claim 5, wherein the adhesive is disposed only at a perimeter of the base film, and wherein selectively exposing less than the entire wafer frontside surface area to UV radiation further comprises at least one of: shadowing a portion of the edge seal from the UV radiation with a stencil; or scanning the wafer under a UV source along a predetermined path that passes through only portions of the edge seal.

8. The method of claim 7, wherein the UV source has a radiation spot size smaller than a diameter of the wafer.

9. The method of claim 1, wherein the wafer is between 150 μm and 400 μm thick after backgrinding and wherein the base film is EVA at least 300 μm thick or is PET of at least 100 μm thick.

10. The method of claim 9, wherein the wafer is between 150 μM and 250 μm thick after backgrinding, wherein the base film is EVA between 300 μm and 400 μM thick, or is PET between 150 μm and 200 μm thick.

11. The method of claim 2, wherein depositing the BSM with the wafer and pre-cured tape cooled by the BSM deposition system further comprises:
    disposing the pre-cured tape on an electrostatic chuck;
    electrostatically clamping the wafer to the chuck; and
    depositing the BSM onto the wafer backside while maintaining the adhesive at a temperature below 90° C.

12. The method of claim 11, wherein depositing the BSM comprises depositing NiV.

13. The method of claim 1, further comprising: curing un-cured portions of the tape disposed on the wafer frontside after depositing the BSM to separate the adhesive from the entire wafer frontside surface area.

14. A backside metallization (BSM) process, comprising:
    laminating a backgrind (BG) tape comprising a base film and an adhesive to a frontside of a wafer;
    after laminating the backgrind (BG) tape, backgrinding the wafer to a thickness between 150 and 250 μm;
    forming a gas escape path between the base film and the wafer frontside surface after the backgrinding, the gas escape path breaching an edge seal formed by the adhesive to place the wafer frontside surface internal to the edge seal in fluid communication with an environment external to the edge seal;
    depositing the BSM with the wafer and pre-cured BG tape cooled by a BSM deposition system; and
    removing the BG tape from the wafer frontside.

15. The method of claim 14, wherein forming the escape path further comprises pre-curing the tape over at least a portion of the wafer frontside surface area to separate the adhesive from only a portion the wafer frontside.

16. The method of claim 15, wherein the wafer frontside includes topographic features, and wherein pre-curing the tape over at least a portion of the wafer frontside area further comprises exposing the entire frontside surface area to UV radiation to completely remove the edge seal while maintaining adhesive contact with the topographic features.

17. The method of claim 15, wherein the pre-curing of the tape comprises selectively exposing less than the entire wafer frontside surface area to UV radiation.

18. A backside vacuum processing method, comprising:
    forming a gas escape path on a thinned wafer that includes a backside and a frontside with a tape laminated to the frontside, wherein the tape includes a base film and an adhesive, and wherein forming the gas escape path breaches an edge seal formed by the adhesive to place the wafer frontside internal to the edge seal in fluid communication with an environment external to the edge seal, wherein the wafer frontside includes topographic features, and wherein forming the escape path further comprises pre-curing the tape by exposing the entire frontside surface area to UV radiation to separate the adhesive from the wafer frontside at the edge seal while maintaining adhesive contact with the topographic features; and vacuum processing the wafer with the tape disposed on a chuck of a vacuum processing apparatus.

19. A backside metallization (BSM) process, comprising:

laminating a backgrind (BG) tape comprising a base film and an adhesive to a frontside of a wafer;

backgrinding the wafer to a thickness between 150 and 250 µm;

forming a gas escape path between the base film and the wafer frontside surface after the backgrinding, the gas escape path breaching an edge seal formed by the adhesive to place the wafer frontside surface internal to the edge seal in fluid communication with an environment external to the edge seal, wherein the wafer frontside includes topographic features, and wherein forming the gas escape path comprises pre-curing the tape by exposing the entire frontside surface area to UV radiation to completely remove the edge seal while maintaining adhesive contact with the topographic features;

depositing the BSM with the wafer and pre-cured BG tape cooled by a BSM deposition system; and removing the BG tape from the wafer frontside.

\* \* \* \* \*